United States Patent
Lee et al.

(10) Patent No.: US 12,299,869 B2
(45) Date of Patent: May 13, 2025

(54) COMPUTING DEVICE FOR PREDICTING A PROFILE USING DEEP LEARNING AND OPERATING METHOD THEREOF

(71) Applicant: Samsung Electronics Co., Ltd., Suwon-si (KR)

(72) Inventors: Hyeok Lee, Suwon-si (KR); Jaewon Yang, Suwon-si (KR); Sangchul Yeo, Osan-si (KR); Eunju Kim, Yongin-si (KR); Sooryong Lee, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 400 days.

(21) Appl. No.: 17/849,617

(22) Filed: Jun. 25, 2022

(65) Prior Publication Data
US 2023/0196545 A1   Jun. 22, 2023

(30) Foreign Application Priority Data

Dec. 17, 2021   (KR) ........................ 10-2021-0181312

(51) Int. Cl.
| | | |
|---|---|---|
| *G06T 19/00* | (2011.01) | |
| *A61B 6/00* | (2024.01) | |
| *A61B 6/02* | (2006.01) | |
| *G06F 3/04815* | (2022.01) | |
| *G06F 3/04842* | (2022.01) | |
| *G06F 30/27* | (2020.01) | |
| *G06T 7/00* | (2017.01) | |

(Continued)

(52) U.S. Cl.
CPC ............ *G06T 7/0006* (2013.01); *G06F 30/27* (2020.01); *G06V 10/10* (2022.01); *G06V 10/46* (2022.01); *G06T 2207/20081* (2013.01); *G06T 2207/30148* (2013.01)

(58) Field of Classification Search
CPC ......... G06T 7/0006; G06T 2207/20081; G06T 2207/30148; G06F 30/27; G06V 10/10; G06V 10/46
See application file for complete search history.

(56) References Cited

U.S. PATENT DOCUMENTS

| | | |
|---|---|---|
| 8,521,481 B2 | 8/2013 | Tejnil |
| 8,631,359 B1 | 1/2014 | Huang et al. |
| 8,718,354 B2 | 5/2014 | Stroessner et al. |

(Continued)

FOREIGN PATENT DOCUMENTS

KR   1020130090368 A   8/2013

OTHER PUBLICATIONS

Wei Ye et al, "TEMPO: Fast Mask Topography Effect Modeling with Deep Learning", 2020, ISPD '20, Sep. 20-23, 2020, Taipei, Taiwan, pp. 127-134 (8 Pages) (Year: 2020).*

*Primary Examiner* — David F Dunphy
(74) *Attorney, Agent, or Firm* — Muir Patent Law, PLLC (57) ABSTRACT

An operating method of a computing device for predicting a profile using deep learning includes sampling a unique pattern in a full chip, extracting a contour of a resist profile of each of a plurality of heights by performing rigorous simulation corresponding to the unique pattern, preparing an input image and an output image corresponding to the contour of each of the plurality of heights, performing deep learning on the extracted contour using the input image and the output image, and generating a profile prediction model according to performing of the deep leaning.

19 Claims, 12 Drawing Sheets

(51) Int. Cl.
  *G06V 10/10*    (2022.01)
  *G06V 10/46*    (2022.01)

(56) References Cited

U.S. PATENT DOCUMENTS

| | | |
|---|---|---|
| 9,235,662 B2 | 1/2016 | Liu |
| 10,365,557 B2 | 7/2019 | Isoyan et al. |
| 11,061,318 B2 | 7/2021 | Lo et al. |
| 2016/0335384 A1 | 11/2016 | Song et al. |
| 2020/0019069 A1* | 1/2020 | Hasan ................ G03F 7/70641 |
| 2020/0027021 A1 | 1/2020 | Sastry et al. |
| 2021/0150116 A1 | 5/2021 | Fan et al. |
| 2021/0157228 A1 | 5/2021 | Sriraman et al. |

* cited by examiner

|  | Patch size ($\mu m^2$) | One patch simulation time | $s/\mu m^2$ | Fullchip size ($mm^2$) | Full chip simulation time |
|---|---|---|---|---|---|
| Rigorous simulation | 0.25 | 1132s | 4528 | 30 | 26203.7 hours (100%) |
| DL model simulation | 55.3 | 13s | 0.235 | 30 | 1.36 hours (0.005%) |

FIG. 9

COMPUTING DEVICE FOR PREDICTING A PROFILE USING DEEP LEARNING AND OPERATING METHOD THEREOF

CROSS-REFERENCE TO RELATED APPLICATION(S)

This application claims benefit of priority under 35 U.S.C. § 119 to Korean Patent Application No. 10-2021-0181312, filed on Dec. 17, 2021, in the Korean Intellectual Property Office, the disclosure of which is incorporated herein by reference in its entirety.

BACKGROUND

The present inventive concept relates to a computing device for predicting a profile using deep learning and an operating method thereof.

In general, mask correction through optical proximity correction (OPC) technology plays an important role in securing after development inspection (ADI) or after clean inspection (ACI) desired by a designer. For accurate OPC, it is important to secure a model accurately predicting wafer phenomena. These prediction models are largely classified as a rigorous model and a compact model according to calculation speed and accuracy. The rigorous model simulates physical/chemical phenomena of phororesist (PR) up to a bottom thereof. Accordingly, the accuracy is high, and a 3D profile of the PR may be predicted. Meanwhile, such a rigorous model may use a lot of time in the case of full chip verification. The compact model does not simulate a phenomenon as rigorously as the rigorous model, and thus, the compact model cannot predict the 3D profile of the PR. However, since a calculation time of the compact model is short, a full chip is commonly used for verification.

SUMMARY

An aspect of the present inventive concept is to provide a computing device for predicting a profile using deep learning to reduce time taken to generate a resist/etch profile model, and an operating method thereof.

According to an aspect of the present inventive concept, an operating method of a computing device for predicting a profile using deep learning includes: sampling a unique pattern in a full chip; extracting a contour of a resist profile of each of a plurality of heights by performing rigorous simulation corresponding to the unique pattern; preparing an input image and an output image corresponding to the contour of each of the plurality of heights; performing deep learning on the extracted contour using the input image and the output image; and generating a profile prediction model according to performing of the deep leaning.

According to another aspect of the present inventive concept, a computing device for predicting a profile using deep learning includes: at least one processor; and a memory storing a photo resist three-dimensional (3D) profile modeling tool, wherein when the at least one processor executes the photo resist 3D profile modeling tool, the at least one processor may sample a unique pattern in a full chip; extract a contour of a resist profile of each of a plurality of heights by performing a rigorous simulation corresponding to the unique pattern; prepare an input image and an output image corresponding to the contour of each of the plurality of heights; perform deep learning on the extracted contour using the input image and the output image; and generate a profile prediction model according to performing of the deep learning.

According to another aspect of the present inventive concept, an operating method of a computing device for predicting a profile using deep learning includes: measuring sample data; generating a contour for each height by performing rigorous simulation on a layout corresponding to the sample data; and performing multi-channel image-based deep learning model learning on the contour for each height.

BRIEF DESCRIPTION OF DRAWINGS

The above and other aspects, features, and advantages of the present inventive concept will be more clearly understood from the following detailed description, taken in conjunction with the accompanying drawings, in which.

DETAILED DESCRIPTION

Hereinafter, example embodiments of the present inventive concept will be described with reference to the accompanying drawings.

A computing device for predicting a profile and an operating method thereof according to an embodiment of the present inventive concept may generate a deep learning resist three-dimensional (3D) model mimicking a rigorous model and predict a resist 3D profile. A device for predicting a resist 3D profile and an operating method thereof according to an embodiment of the present inventive concept may measure sample data and perform rigorous simulation on a layout to thereby generate a contour for each height, perform model learning using deep learning (e.g., deep convolutional generative adversarial network (DCGAN)), and detect a hotspot defect by using a model for verification. Here, the hotspot is a region of a wafer vulnerable to stochastic repeaters. The present inventive concept may rapidly predict a resist 3D profile or defect through a model with high accuracy using multi-channel image-based deep learning model learning. Herein, the term "channel," when referring to "multi-channel" may refer to a color channel.

Figure 1:
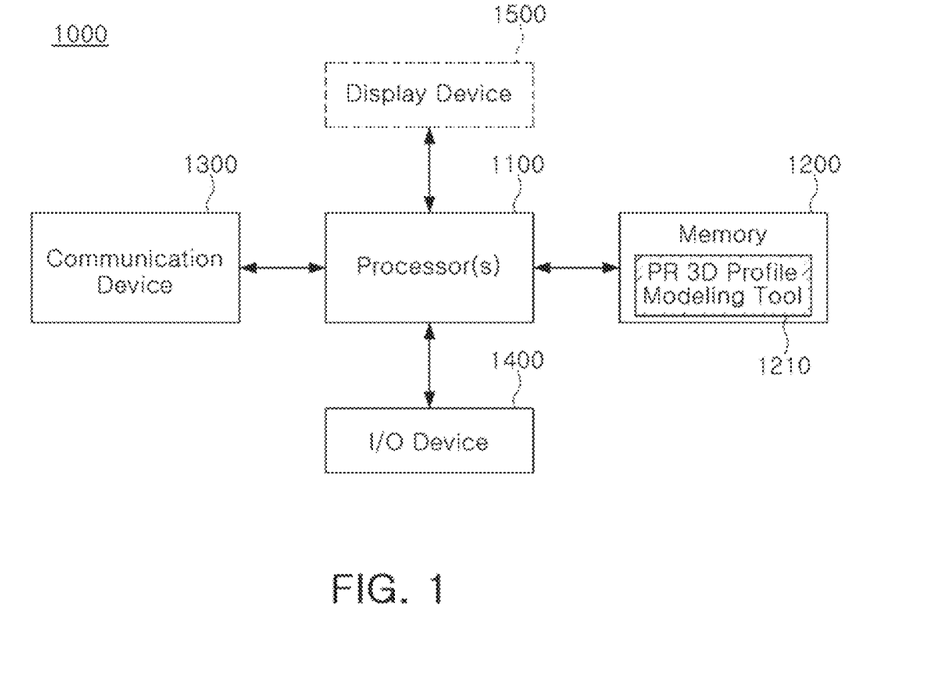
FIG. 1 is a diagram illustrating a computing device for predicting a resist 3D profile, according to an example embodiment of the present inventive concept.

FIG. 1 is a diagram illustrating a computing device 1000 for predicting a resist 3D profile according to an example embodiment of the present inventive concept. Referring to FIG. 1, the computing device 1000 for predicting a resist 3D profile may include at least one processor 1100, a memory 1200, a communication device 1300, an input/output (I/O) device 1400, and a display device 1500.

The at least one processor 1100 may be implemented to control an overall operation of the computing device 1000 for predicting a profile. Also, the processor 1100 may be implemented to execute at least one instruction (or program). The processor 1100 may execute an instruction and control the computing device 1000 for predicting a profile. For example, the at least one processor 1100 may be a central processing unit (CPU) or the like. In an embodiment, the at least one instruction may be executed in at least one processor 1100 to drive a photo resist (PR) 3D profile modeling tool 1210 to predict a resist 3D profile model using machine learning. The computing device 1000 for predicting a profile may be connected to an external device (e.g., a personal computer or a network) through the I/O device 1400 and may exchange data with the external device.

Here, machine learning may operate based on at least one of various algorithms, such as neural networks, support vector machines (SVMs), linear regression, decision trees, generalized linear models (GLM), random forests, gradient boosting machine (GBM), deep learning, clustering, anomaly detection, dimension reduction, etc. In the following, for convenience of explanation, machine learning will be referred to as deep learning.

The memory 1200 may be implemented to store at least one instruction. The processor 1100 may perform the aforementioned operations as at least one instruction stored in the memory 1200 is executed by the at least one processor 1100. In an embodiment, the memory 1200 may store the PR 3D profile modeling tool 1210.

Meanwhile, the memory 1200 may be implemented as a volatile memory or a non-volatile memory. The memory 1200 may include a storage device to store user data. The storage device may be an embedded multimedia card (eMMC), a solid state drive (SSD), or universal flash storage (UFS). The storage device may include at least one non-volatile memory device. Non-volatile memory devices may include a NAND flash memory, a vertical NAND (VNAND) flash memory, a NOR flash memory, a resistive random access memory (RRAM), a phase change memory (PRAM), a magnetoresistive random access memory (MRAM), a ferroelectric random access memory (FRAM), a spin transfer torque random access memory (STT-RAM), etc.

The communication device 1300 may be implemented to communicate with an external network through various wired/wireless methods. For example, the communication device 1300 may perform network communication such as wireless fidelity (Wi-Fi), Wi-Fi Direct, Bluetooth, ultra-wideband (UWB) or near field communication (NFC), universal serial bus (USB), high definition multimedia interface (HDMI), or local area network (LAN).

The display device 1400 may be implemented as a display of various types, such as a liquid crystal display (LCD), an organic light emitting diode (OLED) display, an active-matrix organic light-emitting diode (AM-OLED), a plasma display panel (PDP), and the like.

In general, a device for predicting a photo resist 3D profile performs a physically/chemically complex rigorous simulation. Such a rigorous simulation has excellent predictive power, but it is allowed for partial simulation, not full-chip simulation.

The computing device 1000 for predicting a profile according to an embodiment of the present inventive concept reduces a prediction simulation time for a resist profile and enables a full-chip simulation by learning a deep learning model to predict a profile according to a height of interest of the photo resist in a mask. In an embodiment, an optical proximity correction prediction model may be verified using a profile prediction model predicted by the computing device 1000. In an embodiment, a hotspot defect may be detected in verification of a full chip using a profile prediction model.

In particular, the computing device 1000 for predicting a profile according to an embodiment of the present inventive concept may perform a deep learning model simulation using a multi-channel image.

Figure 2:
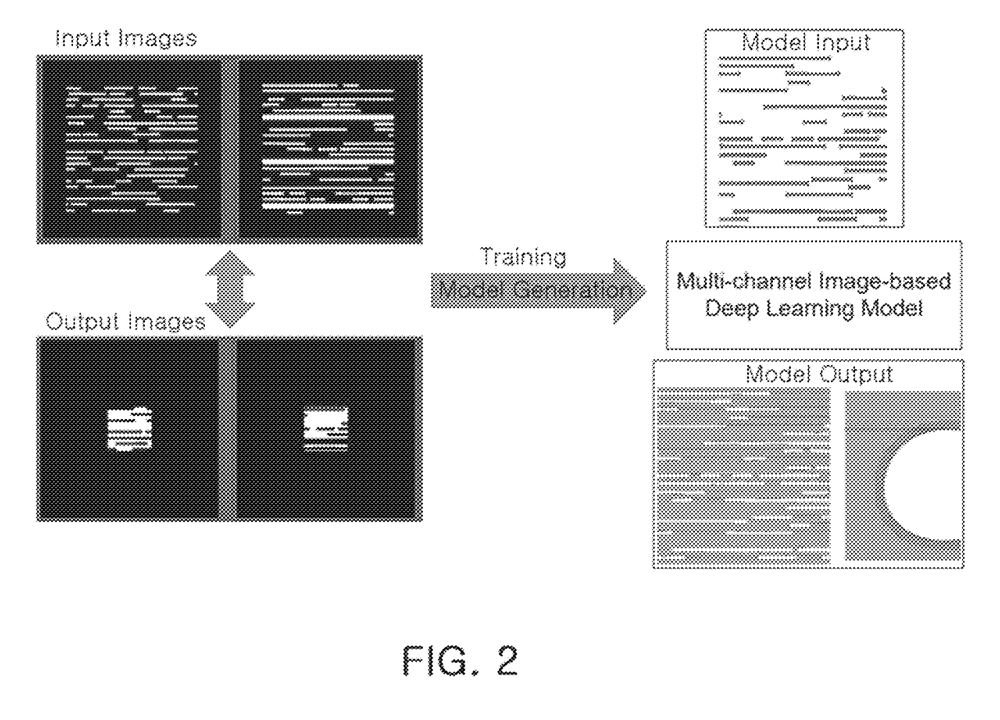
FIG. 2 is a diagram conceptually illustrating a profile prediction deep learning operation of a computing device for predicting a profile, according to an example embodiment of the present inventive concept.

FIG. 2 is a diagram conceptually illustrating a profile prediction deep learning operation of the computing device 1000 for predicting a profile according to an example embodiment of the present inventive concept. Referring to FIG. 2, the computing device 1000 for predicting a profile may perform deep learning using a multi-channel image to predict a 3D profile of a resist/etch.

A multi-channel image-based deep learning model may be generated using an input image and an output image. An output model for an input model related to a resist profile may be generated using a multi-channel image-based deep learning model.

As illustrated in FIG. 2, a profile model for predicting a resist 3D profile may be generated using a multi-channel image-based deep learning model. For example, by learning a resist contour for each height of a portion of a full-chip obtained through rigorous simulation, a model for predicting a resist contour for each height of the corresponding entire chip may be generated. Accordingly, the multi-channel image-based deep learning model method of the present inventive concept may be used quickly and accurately by replacing a physical/chemical simulation model requiring a lot of time to predict a 3D profile of the photo resist.

Meanwhile, the multi-channel image-based deep learning model method according to an embodiment of the present inventive concept may be used to detect hotspots. For example, a hotspot may be detected using a resist profile for each height.

In addition, the multi-channel image-based deep learning model method according to an embodiment of the present inventive concept may be used to predict a resist contour for each height of the full chip. For example, a resist contour for each height of the full chip may be predicted based on the generated prediction model. In addition, various algorithms (pinch, bridge, layer overlap, contour slope, etc.) for detecting hotspots may be used based on the predicted (generated) contour. Therefore, the multi-channel image-based deep learning model method of the present inventive concept may be used to predict hotspots in advance and respond to the predicted hotspots.

The computing device for predicting a profile according to an embodiment of the present inventive concept enables full chip simulation by rapidly predicting a resist 3D profile through multi-channel image-based deep learning.

Figure 3A:
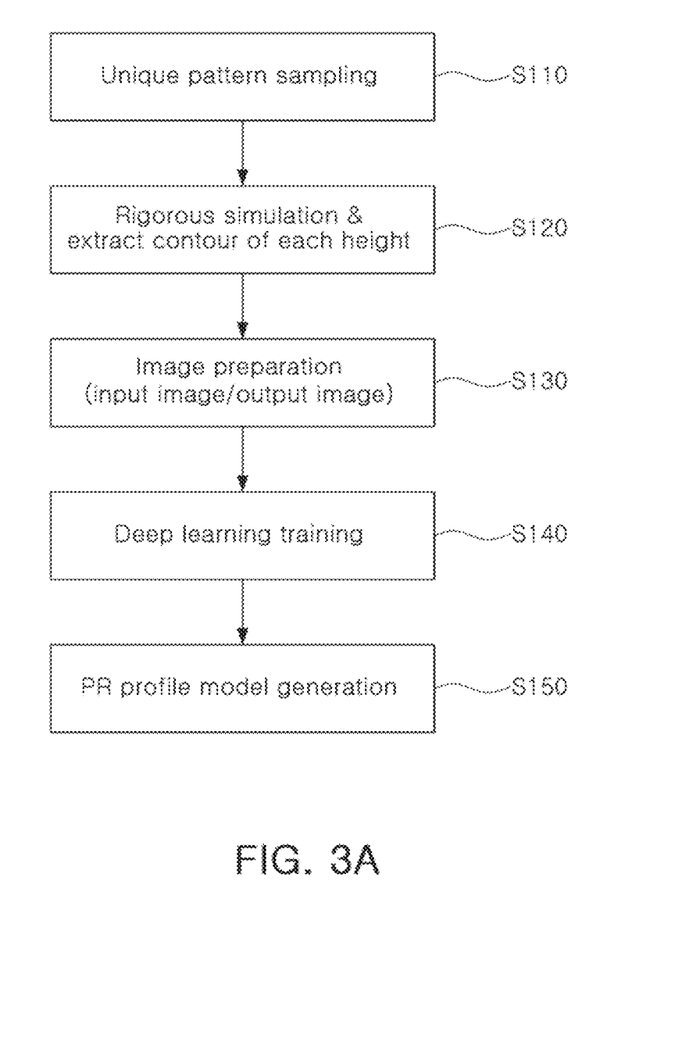
FIG. 3A is a flowchart illustrating an operation of generating a multi-channel image-based deep learning model of a computing device for predicting a profile, according to an example embodiment of the present inventive concept.

FIG. 3A is a flowchart illustrating an operation of generating a multi-channel image-based deep learning model of the computing device 1000 for predicting a profile according to an example embodiment of the present inventive concept. In example embodiments, the processor 1100 may perform the operations of FIG. 3A using one or more instructions stored in the memory 1200. For example, the processor 1100 may access the memory 1200 and execute one or more instructions stored therein to perform the operations of FIG. 3A. Referring to FIG. 3A, a process of generating a multi-channel image-based deep learning model may proceed as follows.

Coordinates for a unique pattern may be sampled (or extracted) in the full chip (S110). A rigorous simulation in the sampled coordinates may be performed, and a contour according to each height may be extracted (S120). An image (e.g., an input image, an output image) for deep learning may be prepared (S130). Deep learning may be performed using an image prepared to generate a 3D profile prediction model (S140).

Here, deep learning may use a generative adversarial network (GAN). In general, the GAN includes a generator network and a discriminator network. The generator network is trained to generate an image from random noise, and the discriminator network is trained to distinguish the generated image from a real image. Also, the generator network is trained to fool the discriminator network. After training, the generator network generates an image indistinguishable from the real image. Iterative training on the two networks may cause the generator to generate an image that is indistinguishable from the real image. In an example embodiment, deep learning may use a deep convolutional generative adversarial network (DCGAN). However, it should be understood that the deep learning method of the present inventive concept is not limited to DCGAN.

A 3D profile prediction model according to a result of deep learning training may be generated (S150). Here, the 3D profile prediction model may be a multi-channel image-based deep learning model.

In an embodiment, the resist 3D profile for the full chip may be evaluated using the profile prediction model. In an embodiment, a defect may be verified by predicting a contour of the photo resist for each height. In an embodiment, an etch model simulation may be performed by predicting the contour of the photo resist for each height.

The operating method of the computing device 1000 for predicting a profile according to an embodiment of the present inventive concept may predict a 3D profile by learning a deep learning model with respect to a contour for each height.

Figure 3B:
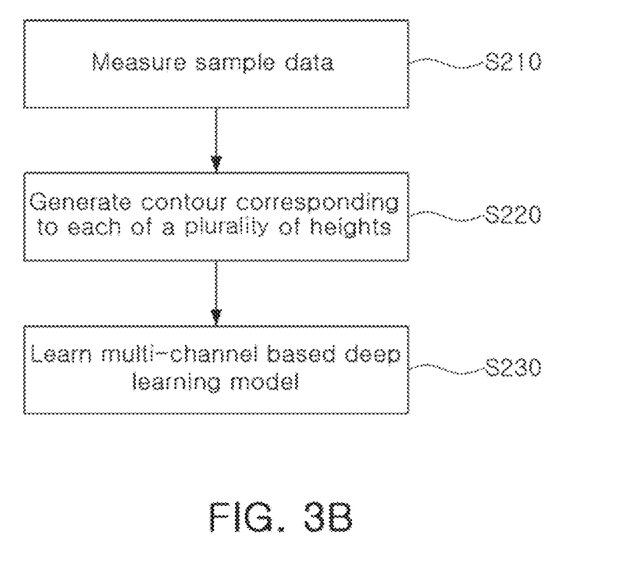
FIG. 3B is a flowchart illustrating an operation of a computing device for predicting a profile, according to an example embodiment of the present inventive concept.

FIG. 3B is a flowchart illustrating an operation of the computing device 1000 for predicting a profile according to an example embodiment of the present inventive concept. In example embodiments, the processor 1100 may perform the operations of FIG. 3B using one or more instructions stored in the memory 1200. For example, the processor 1100 may access the memory 1200 and execute one or more instructions stored therein to perform the operations of FIG. 3B. Referring to FIG. 3B, the operation of the computing device 1000 for predicting a profile may proceed as follows.

Sample data may be measured (S210). By performing a rigorous simulation on a layout corresponding to the sample data, a contour for each height may be generated (S220), and multi-channel image-based deep learning model learning may be performed for the contour for each height (S230).

In an example embodiment, a height at which overlap occurs may be predicted through contour prediction according to the height. In an example embodiment, a hotspot may be determined in consideration of the degree of overlap and a margin of the pattern. In an example embodiment, a slope of the resist profile may be predicted using the contour for each height through multi-channel image-based deep learning model learning. In an example embodiment, a resist 3D profile prediction model may be generated through multi-channel image-based deep learning model learning. In an example embodiment, one or more of a height at which overlap occurs may be predicted through contour prediction according to the height, a hotspot may be determined in consideration of the degree of overlap and a margin of the pattern, a slope of the resist profile may be predicted using the contour for each height through multi-channel image-based deep learning model learning, and a resist 3D profile prediction model may be generated through multi-channel image-based deep learning model learning.

The operating method of the computing device 1000 for predicting a profile according to an embodiment of the present inventive concept may perform multi-channel image-based deep learning model learning on contours for each height.

Figure 4:
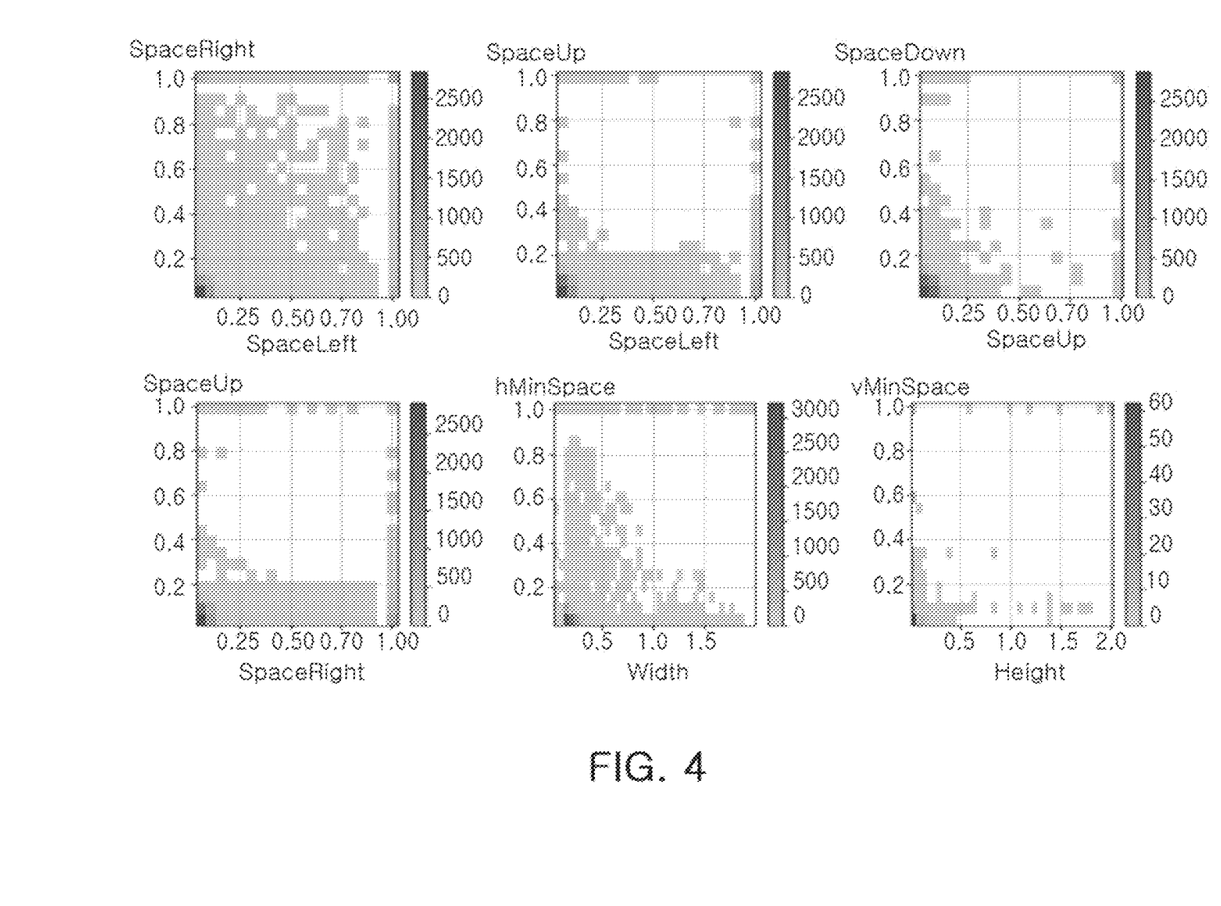
FIG. 4 is a view illustrating sampling of a unique pattern, according to an example embodiment of the present inventive concept.

FIG. 4 is a view illustrating sampling of a unique pattern according to an example embodiment of the present inventive concept.

In order to generate a model with high accuracy and coverage in a full chip simulation, a process of sampling a unique pattern to be used for deep learning model training is required. In this sampling process, pattern coordinates requiring high accuracy and coordinates including a unique pattern may be extracted. For example, about 7,000 to 10,000 points may be extracted during this sampling process.

Meanwhile, the contour of the resist profile for each height to be used for learning may be extracted through rigorous simulation with respect to the coordinates extracted in the sampling process.

Figure 5A:
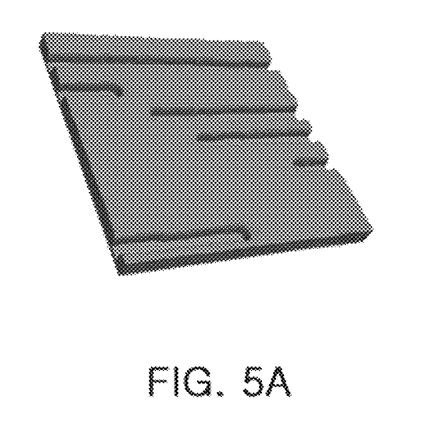
FIG. 5A is a diagram illustrating performing rigorous simulation on one chip.
Figure 5B:
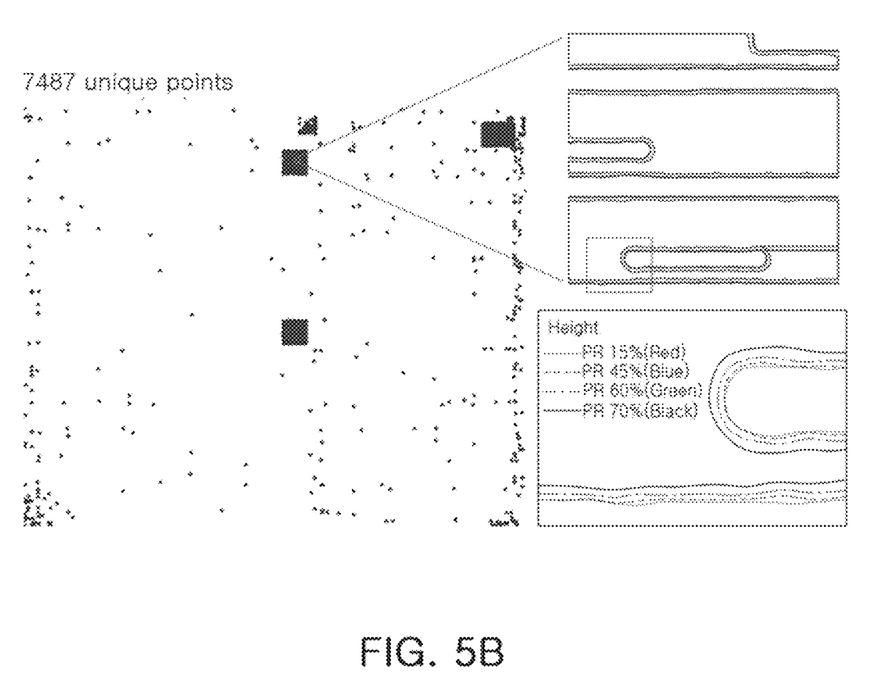
FIG. 5B is a diagram illustrating a process of extracting a contour according to a height of each photo resist.

FIG. 5A is a diagram illustrating rigorous simulation performed on one chip, and FIG. 5B is a diagram illustrating a process of extracting a contour according to a height of each photo resist. In an embodiment, the extracted contour of the profile may be stored as a graphic design system (GDS) file. As illustrated in FIG. 5B, four contours according to height may be extracted. Also, referring to FIG. 5B, the results for one coordinate are illustrated.

For multi-channel image-based deep learning, an image is generated from the extracted contour for each height.

Meanwhile, an image that is an input for learning may be used in various manners, such as an optical proximity corrected mask (OPCed), a target database (target DB), etc. In an embodiment, the input image may include a single channel image. In addition, for an image that is an output image for learning, the contour for each height generated through rigorous simulation may be used. In an embodiment, an output image may include a multi-channel image that uses three or more heights. That is, the output image is a multi-channel multi-height image.

For example, the output image may use different channel (color) images according to the height. As illustrated in FIG. 5B, a red channel image may be used at a profile height of 15%, a blue channel image may be used at a profile height of 45%, a green channel image may be used at a profile height of 60%, and a black channel image may be used at a profile height of 70%. Meanwhile, it should be understood that the aforementioned heights and relationships between the channel and the profile are merely an example.

Figure 6A:
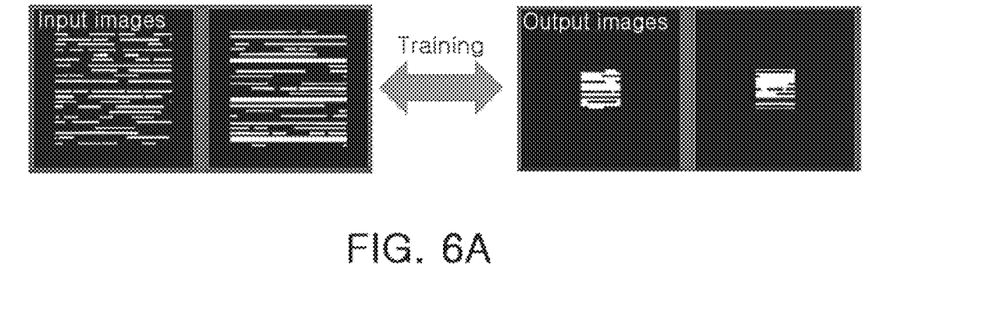
FIG. 6A is a diagram illustrating input images and output images, according to an example embodiment of the present inventive concept.
Figure 6B:
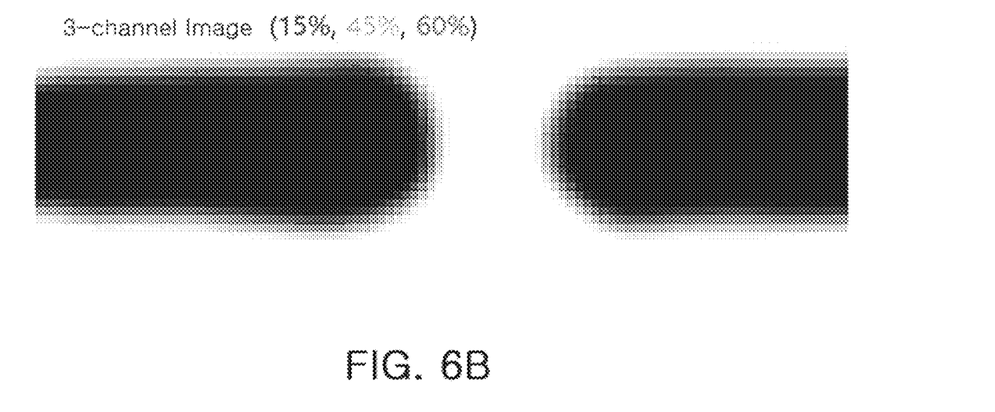
FIG. 6B is an enlarged view of some of input/output images used for training and an output image.

FIG. 6A is a diagram illustrating input images and output images according to an example embodiment of the present inventive concept, and FIG. 6B is an enlarged view of some of the input/output images used for training and an output image.

In FIG. 6A, input images are input to a training model, and output images are output from the training model. In FIG. 6B, a three-channel image is illustrated. As shown in FIG. 6B, 15% of a PR height is illustrated as a blue channel, 45% as a green channel, and 60% as a red channel. Meanwhile, it should be understood that the color of the channel according to the height is not limited thereto.

Meanwhile, when these input/output images are prepared, deep learning is possible using a lithography generative adversarial network, such as Samsung lithography generative adversarial network (SLGAN). Multi-channel image-based deep learning models may be generated to predict rigorous resist 3D profile contours.

Figure 7:
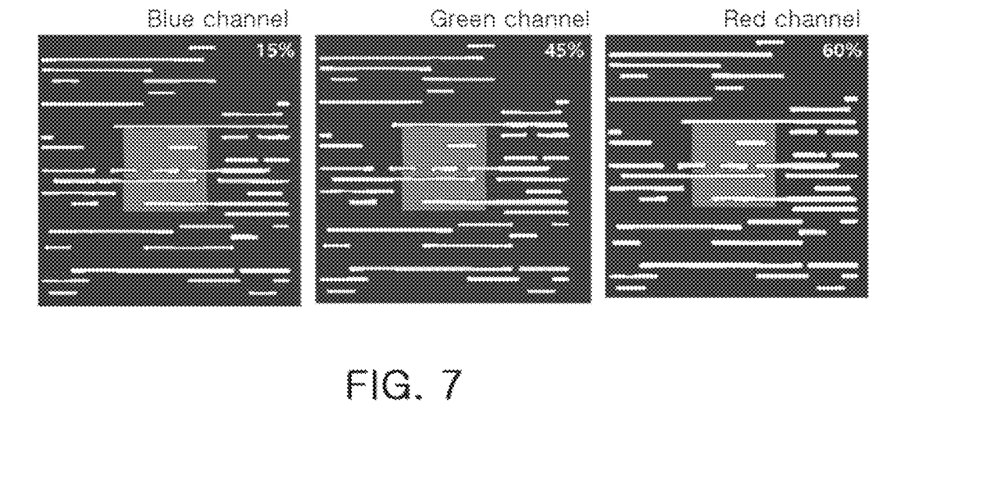
FIG. 7 is a diagram comparing samples used for model training and the results of applying a multi-channel deep learning model, according to an example embodiment of the present inventive concept by height (15%, 45%, and 60%)

FIG. 7 is a diagram comparing samples used for model learning and the results of applying a multi-channel deep learning model according to an example embodiment of the present inventive concept by heights (15%, 45%, 60%). Referring to FIG. 7, a simulation result for a full chip is illustrated through the generated model.

As illustrated in FIG. 7, it can be seen that not only the sample used for learning but also the surrounding area are predicted with high accuracy. In addition, by dramatically reducing a calculation time for generating a profile model, it is possible to predict a full chip.

Figure 8A:
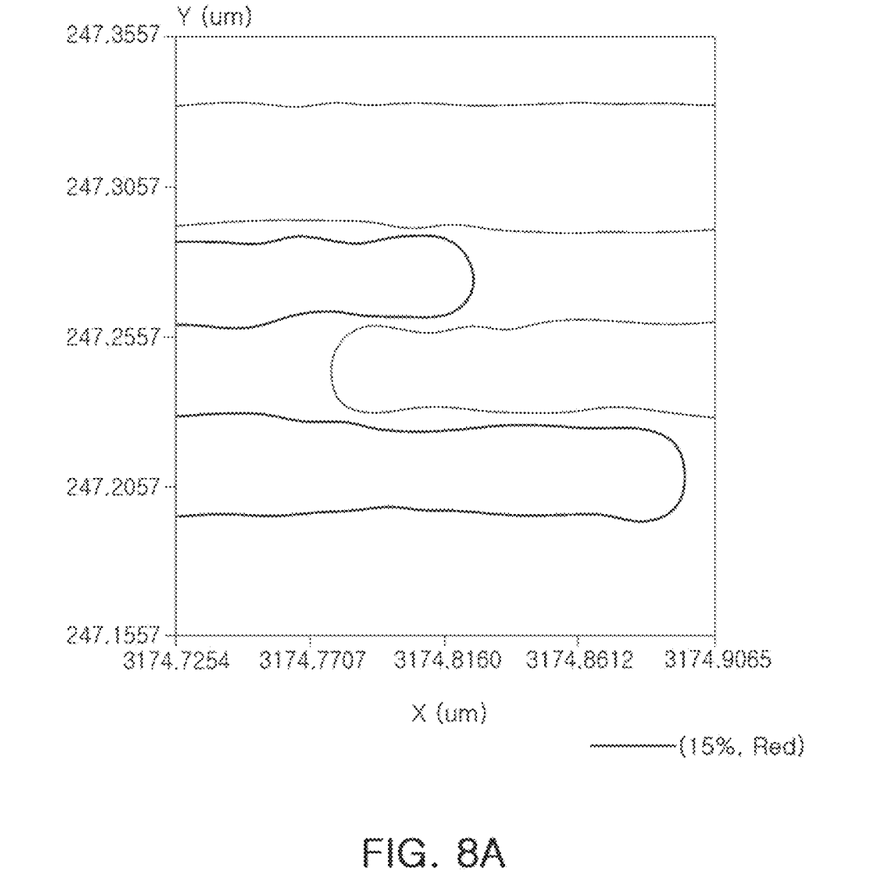
FIGS. 8A, 8B, and 8C are diagrams illustrating hotspot detection using a resist 3D profile, according to an example embodiment of the present inventive concept.
Figure 8B:
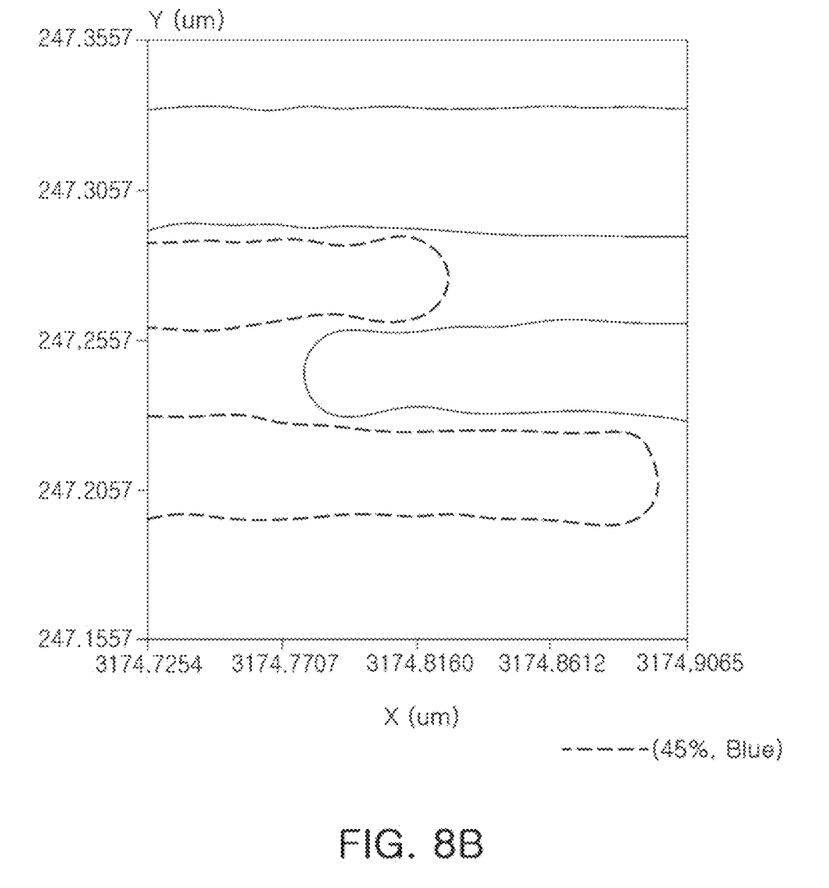
Figure 8C:
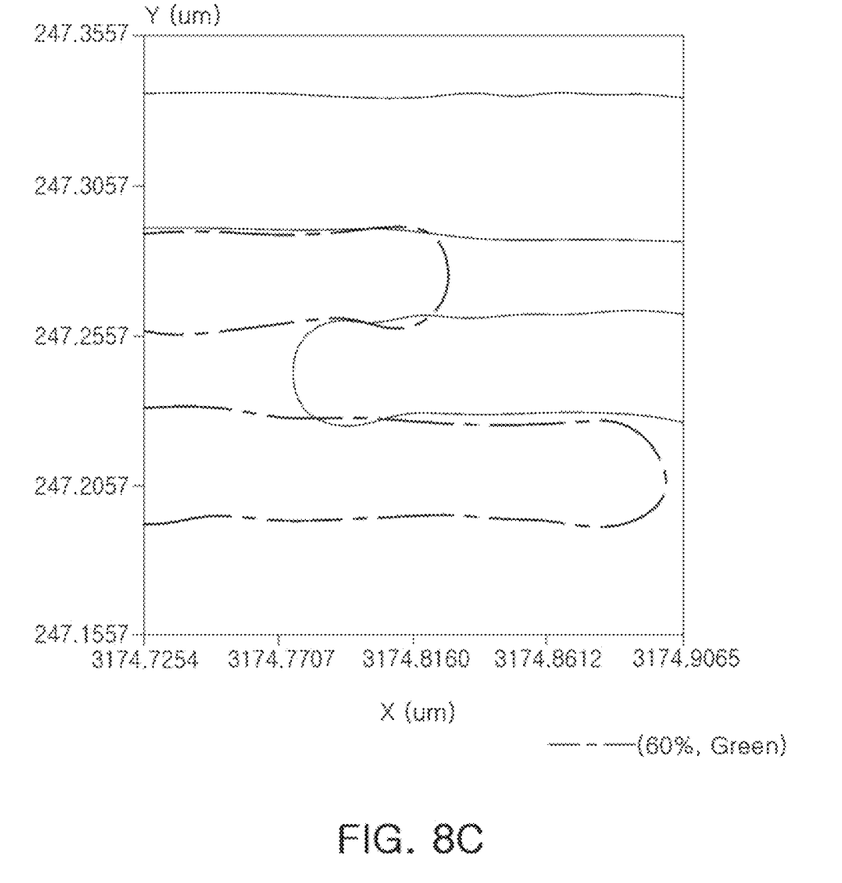

FIGS. 8A, 8B, and 8C are diagrams illustrating hotspot detection using a resist 3D profile according to an example embodiment of the present inventive concept. Using the multi-channel image of the present inventive concept, it is possible to predict a height at which overlap occurs through contour prediction according to the height. Referring to a multi-channel image in FIGS. 8A and 8B, which illustrate 15% as a red channel and 45% as a blue channel, respectively, there are no overlapping sections, but in the case of FIG. 8C, which illustrates 60% as a green channel, there is an overlapping section. Such an overlapping section may be determined as a hotspot.

In an embodiment, a hotspot may be determined in consideration of a degree of overlap and a margin of a pattern. In addition, a slope of the resist profile may be predicted by the contour for each height predicted by deep learning.

Figure 9:
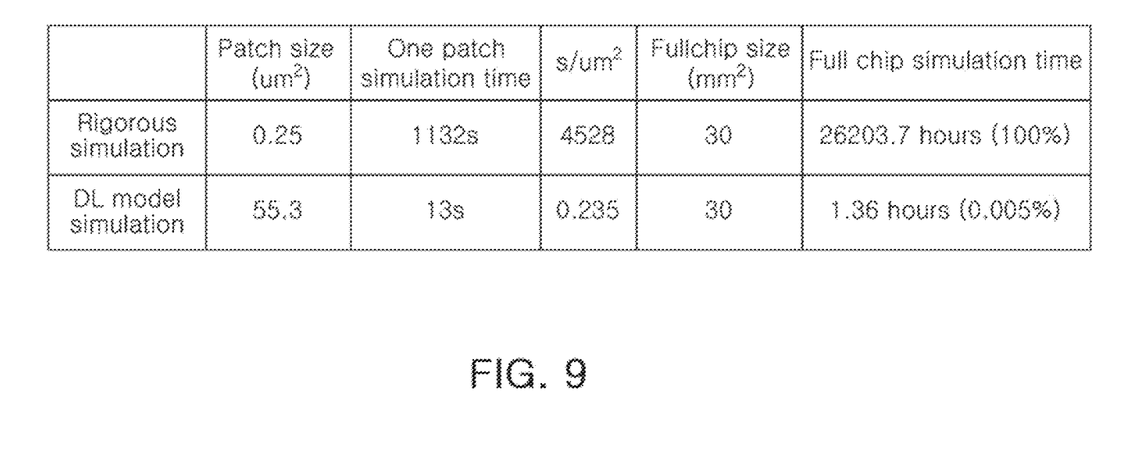
FIG. 9 is a view comparing a calculation time of a prediction device using a rigorous simulation model of the related art and a multi-channel image-based deep learning model of the present inventive concept.

FIG. 9 is a view comparing a calculation time of a prediction device using a rigorous simulation model of the related art and a multi-channel image-based deep learning model of the present inventive concept by way of example.

Referring to FIG. 9, contour generation times for each height are compared. In comparing a calculation time of the rigorous simulation model and the multi-channel image-based deep learning model, it may not be possible to measure a simulation time for the same area. For this reason, a full-chip simulation time is estimated and compared in consideration of a patch size and a simulation time per patch with a single core.

The rigorous simulation takes an average of 1132 s to calculate a 0.5 um×0.5 um patch. Meanwhile, the multi-channel image-based deep learning model of the present inventive concept requires an average of 13 s to calculate a 7.438 um×7.438 um patch. If this is converted into hours per $\mu m^2$ and the calculation time for a 30 $\mu m^2$ full chip is converted into 1440 cores (24 cores, 60 servers), they are 26203 hours and 1.36 hours, respectively. The multi-channel image-based deep learning model method of the present inventive concept enables full chip resist 3D profile simulation.

The embodiments described above may be implemented using hardware components, software components, or a combination thereof. For example, the devices, methods, and components described in embodiments may be implemented using one or more general-purpose or special purpose computers, such as a processing device (e.g., processor 1100), a controller, an arithmetic logic unit (ALU), a digital signal processor, a microcomputer, a field programmable array, a programmable logic unit, a microprocessor or any other device capable of responding to and executing instructions. The processing device may run an operating system (OS) and one or more software applications that run on the OS. The processing device also may access, store, manipulate, process, and create data in response to execution of the software. For purpose of simplicity, the description of a processing device is used as singular; however, one skilled in the art will appreciated that a processing device may include multiple processing elements and multiple types of processing elements. For example, a processing device may include multiple processors or a processor and a controller. In addition, different processing configurations are possible, such as parallel processors.

The software may include a computer program, a piece of code, an instruction, or some combination thereof, to independently or collectively instruct or configure the processing device to operate as desired. Software and data may be embodied permanently or temporarily in any type of machine, component, physical or virtual equipment, computer storage medium or device, or in a propagated signal wave capable of providing instructions or data to or being interpreted by the processing device. The software also may be distributed over network coupled computer systems so that the software is stored and executed in a distributed fashion. The software and data may be stored by one or more non-transitory computer readable recording mediums.

The methods according to the above-described embodiments may be recorded in non-transitory computer-readable media including program instructions to implement various operations embodied by a computer. The media may also include, alone or in combination with the program instructions, data files, data structures, and the like. The program instructions recorded on the media may be those specially designed and constructed for the purposes of the embodiments, or they may be of the kind well-known and available to those having skill in the computer software arts. Examples of non-transitory computer-readable media include magnetic media such as hard disks, floppy disks, and magnetic tape; optical media such as CD ROM disks and DVDs; magneto-optical media such as optical discs; and hardware devices that are specially configured to store and perform program instructions, such as read-only memory (ROM), random access memory (RAM), flash memory, and the like. Examples of program instructions include both machine code, such as produced by a compiler, and files containing higher level code that may be executed by the computer using an interpreter. The described hardware devices may be configured to act as one or more software modules in order to perform the operations of the above-described embodiments, or vice versa.

In the computing device for predicting a resist profile and an operating method thereof according to an embodiment of the present inventive concept, by learning a deep learning model using a multi-channel image, a calculation time, compared to rigorous simulation, may be remarkably reduced, and by predicting a resist contour for each height, a resist 3D profile may be generated and a full chip verification may be enabled.

The computing device for predicting a profile and an operating method thereof according to an embodiment of the present inventive concept may use a multi-channel image when predicting a 3D profile of resist/etch. The present inventive concept may simulate a resist 3D profile using a multi-channel image-based deep learning model and verify hotspots using the simulated profile.

In the computing device for predicting a profile using deep learning and the operating method thereof according to an embodiment of the present invention, by learning a multi-channel image-based deep learning model, a resist 3D profile may be predicted, while a simulation time is remarkably reduced.

While example embodiments have been illustrated and described above, it will be apparent to those skilled in the art that modifications and variations could be made without departing from the scope of the present inventive concept as defined by the appended claims.

What is claimed is:

1. An operating method of a computing device for predicting a profile using deep learning, the operating method comprising:
    sampling coordinates of a unique pattern across a full chip;
    extracting a contour of a resist profile of each of a plurality of heights by performing rigorous simulation at each coordinate of the unique pattern;
    preparing an input image and an output image corresponding to the contour of each of the plurality of heights;
    performing deep learning on the extracted contour using the input image and the output image; and
    generating a profile prediction model according to the performing of the deep learning,
    wherein the sampled coordinates are less than all coordinates of the full chip.

2. The method of claim 1, further comprising storing the extracted contour as a file in a type of a graphics design system (GDS).

3. The method of claim 1,
    wherein the input image includes a single channel image, and
    wherein the output image includes a multi-channel image.

4. The method of claim 1, wherein the input image is used in an optical proximity corrected mask or a target database.

5. The method of claim 1, wherein the output image is used in a contour for each height generated through the rigorous simulation.

6. The method of claim 1, wherein the performing the deep learning includes performing model learning using a deep convolutional generative adversarial network (DC-GAN).

7. The method of claim 1, wherein the profile prediction model includes a multi-channel image-based deep learning model.

8. The method of claim 1, further comprising evaluating a resist 3D profile for the full chip using the profile prediction model.

9. The method of claim 1, further comprising verifying a defect by predicting a contour of a photo resist for each height.

10. The method of claim 1, further comprising performing an etch model simulation by predicting a contour of a photo resist for each height.

11. A computing device for predicting a profile using deep learning, the computing device comprising:
    at least one processor configured to execute a photo resist three-dimensional (3D) profile modeling tool; and
    a memory configured to store the photo resist 3D profile modeling tool,
    wherein when the at least one processor executes the photo resist 3D profile modeling tool, the at least one processor:
        samples coordinates of a unique pattern across a full chip;
        extracts a contour of a resist profile of each of a plurality of heights by performing a rigorous simulation at each coordinate of the unique pattern;
        prepares an input image and an output image corresponding to the contour of each of the plurality of heights;
        performs deep learning on the extracted contour using the input image and the output image; and
        generates a profile prediction model according to performing of the deep learning,
        wherein the sampled coordinates are less than all coordinates of the full chip.

12. The computing device of claim 11, wherein the profile prediction model includes a multi-channel image-based deep learning model.

13. The computing device of claim 11, wherein the input image is a single channel image, and the output image is a 3-channel image.

14. The computing device of claim 11, wherein an optical proximity corrected prediction model is verified using the profile prediction model.

15. The computing device of claim 11, wherein a hot spot defect is detected using the profile prediction model generated for the full chip.

16. An operating method of a computing device for predicting a profile using deep learning, the operating method comprising:
    measuring sample data;
    generating a contour for each height by performing rigorous simulation on a layout corresponding to the sample data;
    performing multi-channel image-based deep learning model learning on the contour for each height; and
    predicting a tilt of a resist profile using the contour for each height through the multi-channel image-based deep learning model learning.

17. The operating method of claim 16, further comprising predicting a height at which an overlap is formed through contour prediction based on the height.

18. The operating method of claim 17, further comprising determining a hotspot in consideration of a degree of the overlap and a margin of a pattern.

19. The operating method of claim 16, further comprising generating a resist 3D profile prediction model through the multi-channel image-based deep learning model learning.

* * * * *